United States Patent
Shimakawa

(10) Patent No.: US 8,797,117 B2
(45) Date of Patent: Aug. 5, 2014

(54) MODULATION CIRCUIT WITH BALUN SHIELDING

(75) Inventor: Junya Shimakawa, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 488 days.

(21) Appl. No.: 13/169,095

(22) Filed: Jun. 27, 2011

(65) Prior Publication Data
US 2011/0316642 A1  Dec. 29, 2011

(30) Foreign Application Priority Data
Jun. 28, 2010 (JP) ................... 2010-145988

(51) Int. Cl.
*H03H 7/38* (2006.01)
*H03H 7/42* (2006.01)
*H03H 1/00* (2006.01)
*H03H 5/00* (2006.01)

(52) U.S. Cl.
CPC . *H03H 7/38* (2013.01); *H03H 7/42* (2013.01); *H03H 2001/0078* (2013.01); *H03H 5/00* (2013.01)
USPC ............................................. 333/25; 333/32

(58) Field of Classification Search
USPC ............................................. 333/12, 25, 32
See application file for complete search history.

(56) References Cited

U.S. PATENT DOCUMENTS 7,349,717 B2 *  3/2008  Block et al. ............... 455/552.1
2007/0290929 A1  12/2007  Noro et al.

FOREIGN PATENT DOCUMENTS

JP  2007-243559 A  9/2007

OTHER PUBLICATIONS

J. Kasemodel, C. Chen, and J. Volakis, Low-Cost, Planar and Wideband Phased Array with Integrated Balun and Matching Network for Wide-Angle Scanning, Jul. 11, 2010, 210 IEEE Antennas and Propagation Society International Symposium (APSURSI).*

* cited by examiner

*Primary Examiner* — Stephen Jones
*Assistant Examiner* — Scott S Outten
(74) *Attorney, Agent, or Firm* — Keating & Bennett, LLP

(57) ABSTRACT

A module includes a substrate including an IC disposed on an upper surface side thereof. The IC includes a modulation circuit unit arranged to modulate a baseband signal into an RF signal and a demodulation circuit unit arranged to demodulate an RF signal into a baseband signal. The substrate includes a first wiring layer provided on the upper surface side, a second wiring layer disposed on a lower surface side of the first wiring layer, and an insulator layer disposed between the first wiring layer and the second wiring layer. A baseband signal-use wiring pattern is provided in the first wiring layer, an RF signal-use wiring pattern is provided in the second wiring layer, and on one surface of the insulator layer, a substantially flat-plate ground electrode pattern is arranged to cover substantially an entire surface. A balun is provided in the second wiring layer.

3 Claims, 4 Drawing Sheets

MODULATION CIRCUIT WITH BALUN SHIELDING

BACKGROUND OF THE INVENTION

1. Field of the Invention

The present invention relates to a module including a substrate on which an IC is mounted, the IC including a modulation circuit unit configured to modulate a baseband signal into an RF signal and a demodulation circuit unit configured to demodulate an RF signal into a baseband signal.

2. Description of the Related Art

Previously, a known module in which an IC is mounted on the surface of a substrate, such as a low temperature co-fired ceramic (LTCC), a multilayer resin substrate, or other suitable substrate and an electrical circuit, such as a balun, a filter, or other suitable electrical circuit connected to the IC has been provided. An example of such a module is disclosed in Japanese Unexamined Patent Application Publication No. 2007-243559 (see, for example, paragraphs [0025] to [0027] and FIGS. 1, 7, and 8). In a module 500 illustrated in FIG. 4A of this application, an IC 502 and various types of surface-mount devices 503 are mounted on the principal surface of a multilayer substrate 501, and electrical circuits, such as a coil 504, a capacitor 505, a balun 506, a filter 507 are provided in a predetermined region inside of the multilayer substrate 501.

As illustrated in FIG. 4B, the balun 506 is provided in a layer L0 to a layer L12 of the multilayer substrate 501, and the main portion thereof is provided in the layer L6 to the layer L12. More specifically, in the layer L10 and the layer L11, an unbalanced-side wiring pattern 508 is provided, into which an RF signal in an unbalanced state is input, the RF signal being input from an antenna terminal (not shown) and being subjected to a predetermined filtering process, and in the layer L9, a balanced-side wiring pattern 509 is provided that is electromagnetically coupled to the unbalanced-side wiring pattern 508 and outputs to the IC 502 the RF signal converted into a balanced state, thereby defining the balun 506.

Using a wiring pattern provided in the layer L11, a coil pattern 508a and a coil pattern 508b provided in the layer L10 are connected to each other through interlayer connection conductors (via conductors), the insides of via holes of which are filled with conductive paste, thereby providing the unbalanced-side wiring pattern 508. In addition, the coil pattern 508a is connected to an input terminal 510 through an interlayer connection conductor 510a provided in the layer L0 to the layer L9.

The balanced-side wiring pattern 509 includes a coil pattern 509a and a coil pattern 509b formed in the layer L9. In addition, the coil pattern 509a is connected to an output terminal 511 through an interlayer connection conductor 511a formed in the layer L0 to the layer L8, and the coil pattern 509b is connected to an output terminal 512 through an interlayer connection conductor 512a formed in the layer L0 to the layer L8, thereby forming the balun 506 indicated by an equivalent circuit in FIG. 4C.

In addition, as illustrated in FIG. 4A, the filter 507 is provided adjacent to the balun 506, in the layer L0 to the layer L6 of the multilayer substrate 501, and the filter 507 subjects the RF signal input from the antenna terminal to predetermined signal processing. In addition, FIGS. 4A to 4C are diagrams illustrating an example of the module 500 of the related art, and FIG. 4A is a cross-sectional view, FIG. 4B is a diagram for explaining a wiring pattern forming the balun 506, and FIG. 4C is a diagram illustrating the equivalent circuit of the balun 506.

Incidentally, while the RF signal in a balance state, output from the balanced-side wiring pattern 509 of the balun 506, is input to the IC 502 through the output terminals 511 and 512, the filter 507 and the various types of electrical circuits 504 and 505 are provided adjacent to the interlayer connection conductors 511a and 512a, in the layer L0 to the layer L8 in which the interlayer connection conductors 511a and 512a (connecting wirings) electrically connecting the balanced-side wiring pattern 509 to the output terminals 511 and 512 are provided. Accordingly, due to electromagnetic coupling between the wiring pattern, which forms the filter 507 and the various types of electrical circuits, such as the coil 504 and the capacitor 505, and the interlayer connection conductors 511a and 512a, a noise signal flowing from the antenna terminal into the filter 507 or into the various types of electrical circuits 504 and 505 may propagate to the interlayer connection conductors 511a and 512a and flow into the IC 502. Therefore, the IC 502 may malfunction as a result of the noise signal flowing to the IC 502.

SUMMARY OF THE INVENTION

To overcome the problems described above, preferred embodiments of the present invention prevent a noise signal included in an RF signal from flowing to an IC mounted on a substrate.

According to a preferred embodiment of the present invention, a module includes a substrate on which an IC is mounted, the IC including a modulation circuit unit configured to modulate a baseband signal into an RF signal and a demodulation circuit unit configured to demodulate an RF signal into a baseband signal, wherein the substrate includes a first wiring layer on an upper surface side of which the IC is disposed, a second wiring layer disposed on a lower surface side of the first wiring layer, and an insulator layer disposed between the first wiring layer and the second wiring layer, a baseband signal-use wiring pattern is provided in the first wiring layer, an RF signal-use wiring pattern is provided in the second wiring layer, and on one surface of the insulator layer, a substantially flat-plate ground electrode pattern is arranged to cover substantially the entire surface, and at least a balun is provided in the second wiring layer and defined by the RF signal-use wiring pattern, and when viewed in a top view, at least a portion of the RF signal-use wiring pattern defining the balun is provided on an upper surface side of the second wiring layer so as to surround a connecting wiring electrically connecting an RF terminal of the IC and a balanced-side terminal of the balun to each other.

In addition, it is preferable that the RF signal-use wiring pattern of the balun, arranged on the upper surface side of the second wiring layer to surround the connecting wiring, is a balanced-side wiring pattern of the balun.

In addition, it is preferable that an unbalanced-side wiring pattern of the balun, defined by the RF signal-use wiring pattern, is provided on a surface side lower than the balanced-side wiring pattern.

In addition, a matching circuit is preferably provided in the second wiring layer, and when viewed in a top view, the matching circuit is surrounded by the RF signal-use wiring pattern defining the balun, and using the connecting wiring, the RF terminal and the balanced-side terminal may preferably be connected to each other through the matching circuit.

According to various preferred embodiments of the present invention, while the IC is mounted on the substrate, the IC including the modulation circuit unit configured to modulate the baseband signal into the RF signal and the demodulation circuit unit configured to demodulate the RF signal into the baseband signal, the baseband signal-use wiring pattern is provided in the first wiring layer disposed on the upper surface side of the substrate, the RF signal-use wiring pattern is provided in the second wiring layer disposed on the lower surface side of the substrate, and on one surface of the insulator layer disposed between the first wiring layer and the second wiring layer, the substantially flat-plate ground electrode pattern is arranged to cover substantially the entire surface. Accordingly, since the ground electrode pattern provided on one surface of the insulator layer defines an electromagnetic shield, the baseband signal-use wiring pattern provided in the first wiring layer and the RF signal-use wiring pattern provided in the second wiring layer are prevented from being electromagnetically coupled to each other, and thus, a noise signal included in the RF signal is prevented from propagating through the RF signal-use wiring pattern, from propagating to the baseband signal-use wiring pattern, and from flowing into the IC.

In addition, while at least the balun is provided in the second wiring layer and defined by the RF signal-use wiring pattern, and the RF terminal of the IC mounted on the substrate and the balanced-side terminal of the balun are electrically connected to each other via the connecting wiring, at least a portion of the RF signal-use wiring pattern defining the balun is provided on the upper surface side of the second wiring layer and arranged to surround the connecting wiring between the IC and the balun, when viewed in a top view. Therefore, the wiring pattern of the balun, which surrounds the connecting wiring, functions as an electromagnetic shield, and a noise signal included in the RF signal that propagates through individual various electrical circuits adjacent to the balun and provided in the second wiring layer, for example, the RF signal-use wiring pattern defining a filter circuit, is effectively prevented from propagating to the connecting wiring between the IC and the balun. Accordingly, the noise signal included in the RF signal is prevented from flowing into the IC mounted on the substrate.

According to various preferred embodiments of the present invention, the RF signal-use wiring pattern provided on the upper surface side of the second wiring layer and arranged to surround the connecting wiring is the balanced-side wiring pattern on the output side of the balun, used to output the RF signal in a balanced state to the IC mounted on the upper surface of the substrate. Therefore, on the upper surface side of the second wiring layer nearest to the IC mounted on the upper surface of the substrate, the balanced-side wiring pattern on the output side can be easily arranged so as to surround the connecting wiring between the IC and the balun.

According to various preferred embodiments of the present invention, the unbalanced-side wiring pattern of the balun defined by the RF signal-use wiring pattern is provided on the surface side lower than the balanced-side wiring pattern. Therefore, by maintaining a large distance between the RF signal-use wiring pattern on the unbalanced side, used to input the RF signal in an unbalanced state to the unbalanced-side wiring pattern, and the connecting wiring between the IC and the balun, it is possible to prevent the noise signal from propagating from the RF signal-use wiring pattern on the unbalanced side to the IC through the connecting wiring.

According to various preferred embodiments of the present invention, the matching circuit arranged to perform impedance matching and phase adjustment is preferably provided in the second wiring layer, and the RF terminal of the IC and the balanced-side terminal of the balun are connected to each other through the matching circuit via the connecting wiring. On the other hand, since the matching circuit is surrounded by the RF signal-use wiring pattern defining the balun when viewed in a top view, the wiring pattern of the balun, which surrounds the matching circuit, functions as an electromagnetic shield, and the noise signal included in the RF signal input through an antenna terminal is prevented from propagating to the matching circuit directly connected to the RF terminal of the IC and flowing into the IC.

The above and other elements, features, steps, characteristics and advantages of the present invention will become more apparent from the following detailed description of the preferred embodiments thereof with reference to the attached drawings.

BRIEF DESCRIPTION OF THE DRAWINGS

FIG. 3I is a plan view of an insulator layer, and FIG. 3J is a plan view of a first wiring layer.

DETAILED DESCRIPTION OF THE PREFERRED EMBODIMENTS

Figure 1:
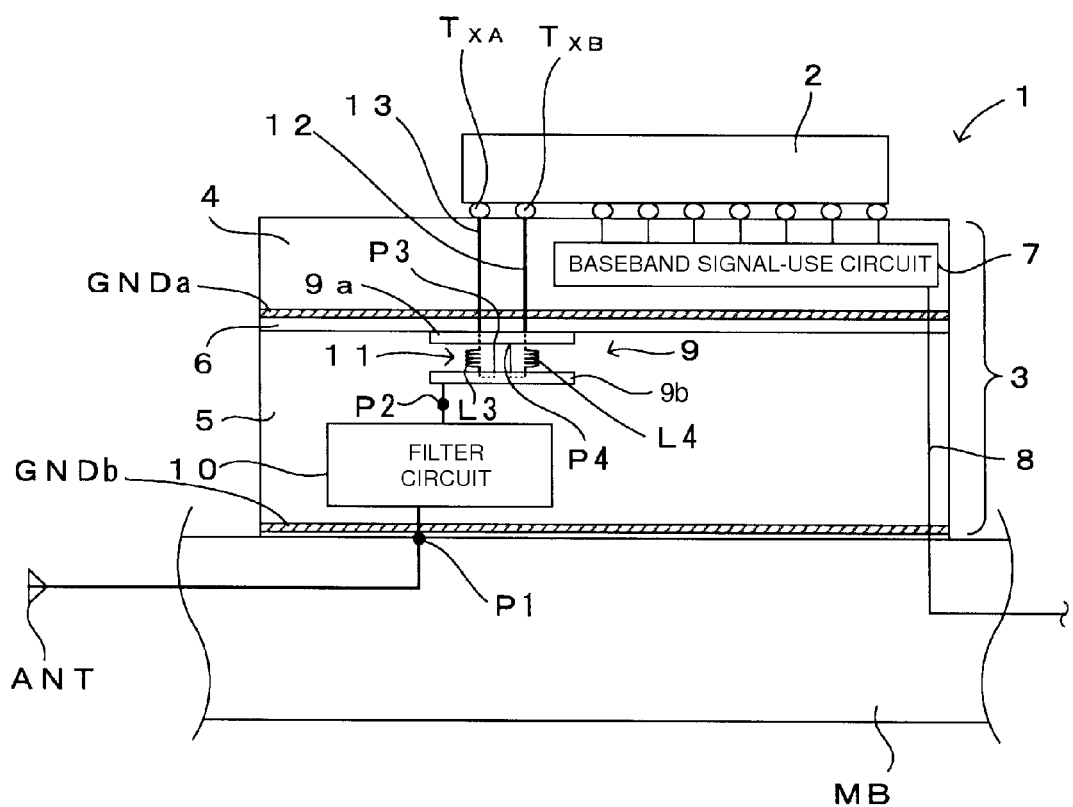
FIG. 1 is a block diagram of a module according to a preferred embodiment of the present invention.
Figure 2:
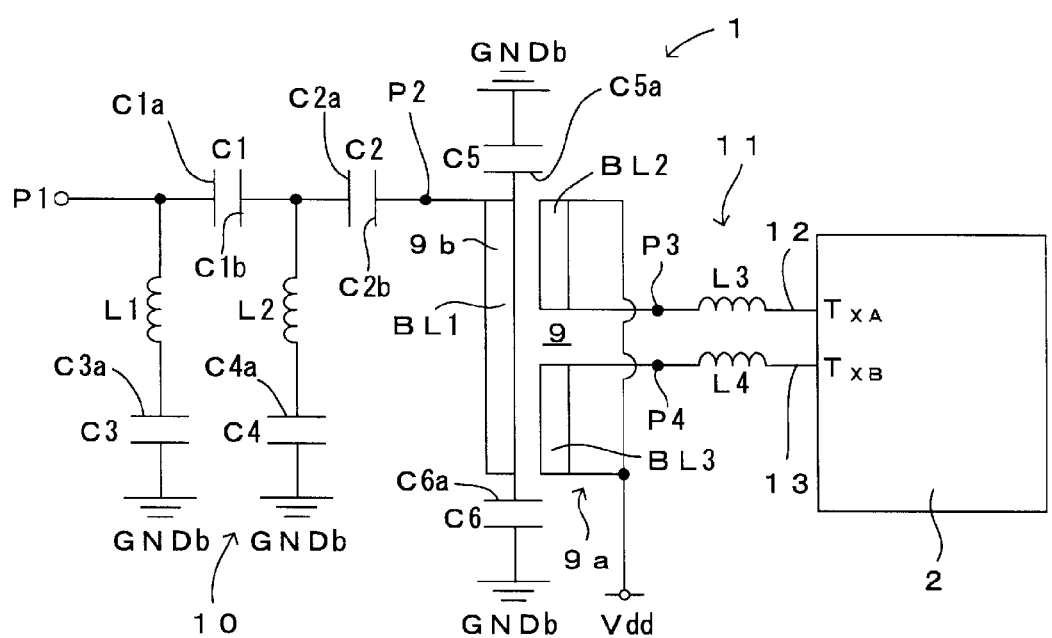
FIG. 2 is a diagram illustrating a circuit configuration of the module in FIG. 1.

A module according to preferred embodiments of the present invention will be described with reference to FIG. 1 to FIG. 3J. FIG. 1 is a block diagram of the module according to a preferred embodiment of the present invention. FIG. 2 is a diagram illustrating the circuit configuration of the module in FIG. 1. FIGS. 3A to 3J are plan views of the module in FIG. 1, FIGS. 3A to 3H are individual plan views of a plurality of layers included in a second wiring layer, FIG. 3I is the plan view of an insulator layer, and FIG. 3J is the plan view of a first wiring layer.

As illustrated in FIG. 1, a module 1 includes a substrate 3 on which an IC 2 is mounted, the IC 2 including a modulation circuit unit configured to modulate a baseband signal into an RF signal and a demodulation circuit unit configured to demodulate an RF signal into a baseband signal, and the module 1 is mounted on a motherboard MB of a wireless communication device (the illustration thereof is omitted) complying with a wireless LAN standard, a Bluetooth (registered trademark) standard, or other suitable standard, for example.

The IC 2 includes a function of modulating a baseband signal used in the wireless communication device into an RF signal as a carrier wave and a function of demodulating an RF signal as a received carrier wave into a baseband signal, and in a block diagram illustrated in FIG. 1, a function is illustrated in which an RF signal input through an antenna terminal ANT is demodulated into a baseband signal used in the wireless communication device.

Preferably, the substrate 3 is formed by laminating and firing a plurality of ceramic green sheets, and includes a first wiring layer 4 on the upper surface side of which the IC 2 is disposed, a second wiring layer 5 disposed on the lower surface side of the first wiring layer, and an insulator layer 6 disposed between the first wiring layer 4 and the second wiring layer 5.

In the first wiring layer 4, various baseband signal-use circuits 7 are provided to process a baseband signal using a baseband signal-use wiring pattern. In addition, the baseband signal-use circuits 7 are connected to the signal line of the motherboard MB through a connecting wiring 8, such as a wiring electrode, a via conductor, or other suitable connecting wiring, for example, embedded in the substrate 3. In the second wiring layer 5, various RF signal-use circuits to process the RF signal, such as a balun 9, a filter circuit 10, a matching circuit 11, and other suitable circuits, for example, defined by an RF signal-use wiring pattern are provided.

In addition, on one surface of the insulator layer 6, a substantially flat-plate ground electrode pattern GNDa is provided and preferably covers substantially the entire surface. In addition, the ground electrode pattern GNDa provided in the insulator layer 6 is used as a ground electrode for the baseband signal-use circuit 7 provided in the first wiring layer 4.

As illustrated in FIG. 2, the filter circuit 10 includes a high pass filter (HPF), and is defined by connecting an LC series circuit, which includes a coil L1 and a capacitor C3 including one end portion that is grounded to an LC series circuit including a coil L2 and a capacitor C4 including one end portion that is grounded through a capacitor C1.

The balun 9 includes a balanced-side wiring pattern 9*a* and an unbalanced-side wiring pattern 9*b*, individually defined by the RF signal-use wiring patterns. Preferably, the balanced-side wiring pattern 9*a* is provided on the upper surface side of the second wiring layer 5, and the unbalanced-side wiring pattern 9*b* is provided on a surface side lower than the balanced-side wiring pattern 9*a*. In addition, preferably, the balanced-side wiring pattern 9*a* includes a coil pattern BL2 and a coil pattern BL3, and the unbalanced-side wiring pattern 9*b* includes a coil pattern BL1 and capacitors C5 and C6. In addition, the capacitors C5 and C6 are preferably provided so that the line length of the coil pattern BL1 is adjusted by adjusting capacitance.

The matching circuit 11 is arranged to perform impedance matching and the adjustment of a phase between balanced-side terminals P3 and P4 of the balun 9 and RF terminals $T_{XA}$ and $T_{XB}$ of the IC 2, and preferably includes coils L3 and L4. In addition, the balanced-side terminal P3 of the balun 9 and the RF terminal $T_{XA}$ of the IC 2 are electrically connected to each other through the coil L3 of the matching circuit 11, using a connecting wiring 12, and the balanced-side terminal P4 of the balun 9 and the RF terminal $T_{XB}$ of the IC 2 are electrically connected to each other through the coil L4 of the matching circuit 11, using a connecting wiring 13.

In addition, as described below with reference to FIGS. 3E to 3H, when being illustrated as a top view, the coil patterns BL2 and BL3 defining the balanced-side wiring pattern 9*a* of the balun 9 and the coil pattern BL1 defining the unbalanced-side wiring pattern 9*b* are preferably arranged so as to surround the coils L3 and L4 defining the matching circuit 11 and the connecting wirings 12 and 13 electrically connecting the RF terminals $T_{XA}$ and $T_{XB}$ of the IC 2 to the balanced-side terminals P3 and P4 of the balun 9.

In addition, the balanced-side terminals P3 and P4 are provided at end portions of the coil patterns BL2 and BL3 defining the balanced-side wiring pattern 9*a* of the balun 9, respectively, and a power source Vdd is connected to the other end portions of the coil patterns BL2 and BL3. Accordingly, the power source Vdd is supplied to the IC 2 through the connecting wirings 12 and 13 and the RF terminals $T_{XA}$ and $T_{XB}$.

Next, an example of a manufacturing method for the module 1 shown in FIG. 1 will be described. A plurality of green sheets are laminated and subjected to low-temperature firing in order of a layer 20 to a layer 29, the plurality of green sheets including the individual layers 20 to 27 that form the second wiring layer 5 illustrated in FIGS. 3A to 3H, the layer 28 that forms the insulator layer 6 illustrated in FIG. 3I, and the layer 29 that forms the first wiring layer 4 illustrated in FIG. 3J, and hence the substrate 3 is formed. In addition to this, the IC 2 is formed on the upper surface of the substrate 3, thereby forming the module 1 according to the present preferred embodiment. In addition, while the first wiring layer 4 has a multi-layer structure in which the baseband signal-use circuit 7 is provided in the inside thereof by laminating the plurality of green sheets, the detailed description of the layer 29 forming the first wiring layer 4 will be omitted in the present preferred embodiment.

First, using a laser, for example, a via hole is formed in a green sheet, and the inside of the via hole is filled with conductive paste, thereby forming a via hole (via conductor) used for interlayer connection. In addition to this, a predetermined pattern is printed preferably using conductive paste, such as Ag, Cu, or other suitable metal, for example, and a plurality of green sheets used to form the individual layers 20 to 29 of the substrate 3 are prepared. In addition, in each green sheet, a plurality of wiring patterns are preferably provided so as to form a large number of the substrates 3 at one time.

Figure 3A:
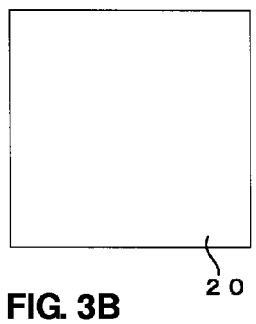
FIGS. 3A to 3J are plan views of the module shown in FIG. 1, FIGS. 3A to 3H are individual plan views of a plurality of layers included in a second wiring layer.
Figure 3B:
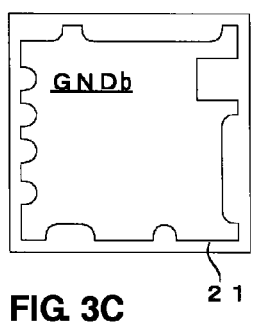

In the layer 20 illustrated in FIG. 3A, various kinds of input/output terminal patterns are formed that are used to mount the module 1 on the motherboard MB (not shown). In the layer 21 illustrated in FIG. 3B, a substantially flat-plate ground electrode pattern GNDb is formed preferably so as to cover substantially the entire surface. In addition, the ground electrode pattern GNDb formed in the layer 21 is preferably used as a ground electrode for an RF signal-use circuit provided in the second wiring layer 5.

Figure 3C:
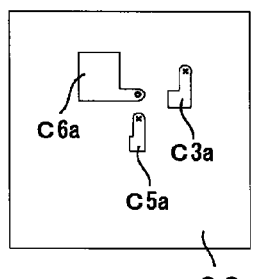
Figure 3D:
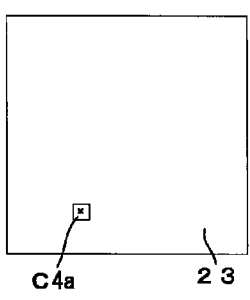

In the layer 22 illustrated in FIG. 3C, electrode patterns C3*a*, C5*a*, and C6*a* used to form electrodes of the capacitor C3 of the filter circuit 10 and the capacitors C5 and C6 of the unbalanced-side wiring pattern 9*b* of the balun 9 are respectively formed. In addition, in the layer 23 illustrated in FIG. 3D, an electrode pattern C4*a* used to form one electrode of the capacitor C4 of the filter circuit 10 is formed, and the capacitors C3, C4, C5, and C6 are formed using the electrode patterns C3*a*, C4*a*, C5*a*, and C6*a* and the ground electrode pattern GNDb in the layer 21.

Figure 3E:
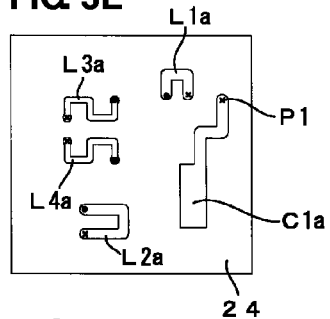
Figure 3F:
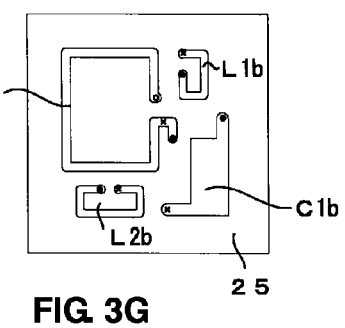

In the layer 24 illustrated in FIG. 3E, an electrode pattern C1*a* used to form one electrode of the capacitor C1 of the filter circuit 10, coil patterns L1*a* and L2*a* used to form the coils L1 and L2, and coil patterns L3*a* and L4*a* used to form the coils L3 and L4 of the matching circuit 11 are formed. In the layer 25 illustrated in FIG. 3F, an electrode pattern C1*b* used to form the other electrode of the capacitor C1 of the filter circuit 10, coil patterns L1*b* and L2*b* used to form the coils L1 and L2, and a coil pattern BL1 used to form the unbalanced-side wiring pattern 9*b* of the balun 9 are formed.

Figure 3G:
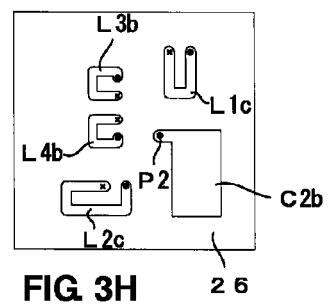
Figure 3H:
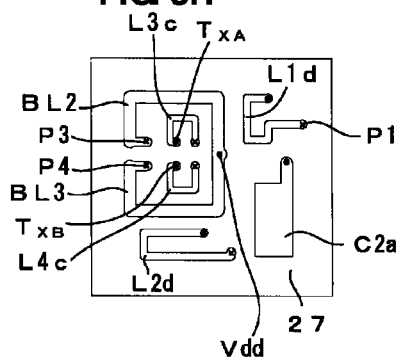
Figure 3I:
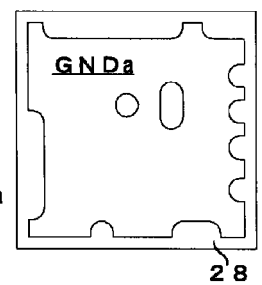
Figure 3J:
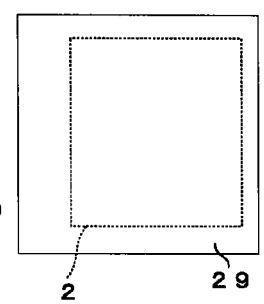
Figure 4A:
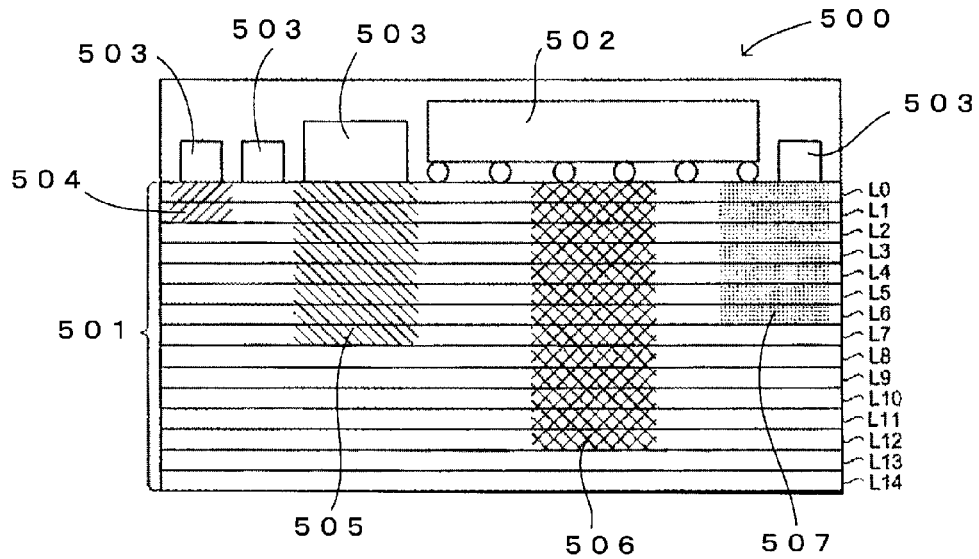
FIGS. 4A to 4C are diagrams illustrating an example of a module of the related art.
Figure 4B:
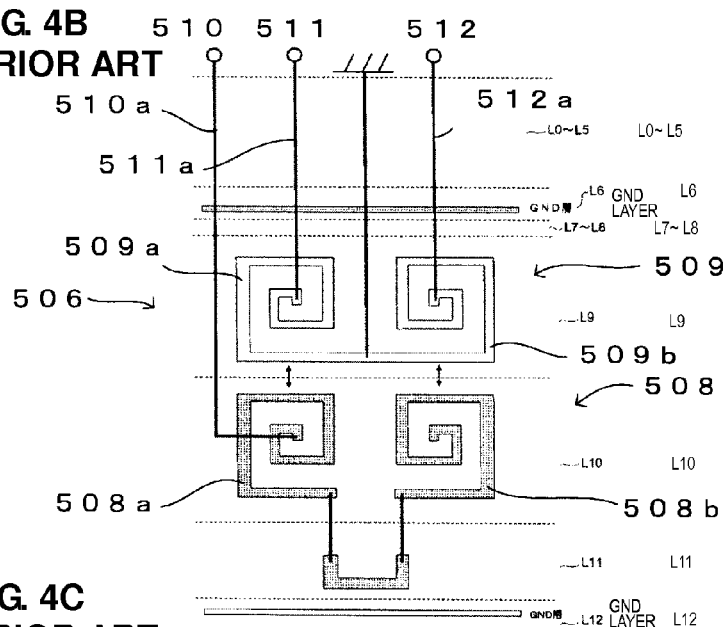
Figure 4C:
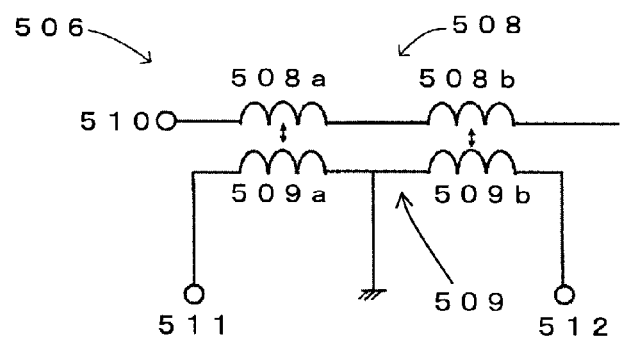

In the layer 26 illustrated in FIG. 3G, an electrode pattern C2*b* used to form the other electrode of the capacitor C2 of the filter circuit 10, coil patterns L1*c* and L2*c* used to form the coils L1 and L2, and coil patterns L3*b* and L4*b* used to form the coils L3 and L4 of the matching circuit 11 are formed. In the layer 27 illustrated in FIG. 3H, an electrode pattern C2*a* used to form one electrode of the capacitor C2 of the filter circuit 10, coil patterns L1*d* and L2*d* used to form the coils L1 and L2, coil patterns L3*c* and L4*c* used to form the coils L3 and L4 of the matching circuit 11, and coil patterns BL2 and BL3 used to form the balanced-side wiring pattern 9*a* of the balun 9 are formed.

In the layer 28 illustrated in FIG. 3I, the ground electrode pattern GNDa of the baseband signal-use circuit 7 is formed. In the layer 29 illustrated in FIG. 3J, various kinds of input/ output terminal patterns are formed that are used to mount the IC 2 on the substrate 3 (not shown).

In addition, a via conductor is formed that electrically connects the "●" mark of the coil pattern L1$a$ in the layer 24 and the "●" mark of the coil pattern L1$b$ in the layer 25 to each other, a via conductor is formed that electrically connects the "x" mark of the coil pattern L1$b$ in the layer 25 and the "x" mark of the coil pattern L1$c$ in the layer 26 to each other, and a via conductor is formed that electrically connects the "●" mark of the coil pattern L1$c$ in the layer 26 and the "●" mark of the coil pattern L1$d$ in the layer 27 to each other, thereby forming the coil L1. In addition, a via conductor is formed that electrically connects one end portion ("x" mark) of the coil pattern L1$d$ in the layer 27 and the "x" mark of one electrode pattern C1$a$ of the capacitor C1 formed in the layer 24 to the input terminal P1 to which the RF signal is input through the antenna terminal ATN, and a via conductor is formed that electrically connects one end portion ("x" mark) of the coil pattern L1$a$ in the layer 24 and the "x" mark of one electrode pattern C3$a$ of the capacitor C3 formed in the layer 22 to each other.

In addition, a via conductor is formed that electrically connects the "●" mark of the coil pattern L2$a$ in the layer 24 and the "●" mark of the coil pattern L2$b$ in the layer 25 to each other, a via conductor is formed that electrically connects the "x" mark of the coil pattern L2$b$ in the layer 25 and the "x" mark of the coil pattern L2$c$ in the layer 26 to each other, and a via conductor is formed that electrically connects the "●" mark of the coil pattern L2$c$ in the layer 26 and the "●" mark of the coil pattern L2$d$ in the layer 27 to each other, thereby forming the coil L2. In addition, a via conductor is formed that electrically connects one end portion ("x" mark) of the coil pattern L2$d$ in the layer 27 and the "x" mark of the other electrode pattern C1$b$ of the capacitor C1 formed in the layer 25 to each other, and a via conductor is formed that electrically connects one end portion ("x" mark) of the coil pattern L2$a$ in the layer 24 and the "x" mark of one electrode pattern C4$a$ of the capacitor C4 formed in the layer 23 to each other.

In addition, a via conductor is formed that electrically connects the "●" mark of the other electrode pattern C1$b$ of the capacitor C1 formed in the layer 25 and the "●" mark of one electrode pattern C2$a$ of the capacitor C2 formed in the layer 27 to each other. In addition, a via conductor is formed that electrically connects the output terminal P2 of the filter circuit 10, formed in the other electrode pattern C2$b$ of the capacitor C2 formed in the layer 26, and the "●" mark of the coil pattern BL1 in the layer 25, which forms the unbalanced-side wiring pattern 9$b$ of the balun 9, to each other.

In addition, a via conductor is formed that connects the "x" mark of the coil pattern BL1 in the layer 25 and the other electrode pattern C5$a$ of the capacitor C5 formed in the layer 22 to each other, and a via conductor is formed that connects the "○" mark of the coil pattern BL1 in the layer 25 and the "○" mark of one electrode pattern C6$a$ of the capacitor C6 formed in the layer 22 to each other.

In addition, a via conductor is formed that electrically connects the "●" mark of the coil pattern L3$a$ in the layer 24 and the "●" mark of the coil pattern L3$b$ in the layer 26 to each other, and a via conductor is formed that electrically connects the "x" mark of the coil pattern L3$b$ in the layer 26 and the "x" mark of the coil pattern L3$c$ in the layer 27 to each other, thereby forming the coil L3. In addition, a via conductor is formed that connects the output terminal P3 of the coil pattern BL2 in the layer 27 and the "x" mark of the coil pattern L3$a$ in the layer 24 to each other, and a via conductor (connecting wiring 12) is formed that connects one end portion ("●" mark) of the coil pattern L3$c$ in the layer 27 and the RF terminal $T_{XA}$ of the IC 2 to each other.

In addition, a via conductor is formed that electrically connects the "●" mark of the coil pattern L4$a$ in the layer 24 and the "●" mark of the coil pattern L4$b$ in the layer 26 to each other, and a via conductor is formed that electrically connects the "x" mark of the coil pattern L4$b$ in the layer 26 and the "x" mark of the coil pattern L4$c$ in the layer 27 to each other, thereby forming the coil L4. In addition, a via conductor is formed that connects the output terminal P4 of the coil pattern BL3 in the layer 27 and the "x" mark of the coil pattern L4$a$ in the layer 24 to each other, and a via conductor (connecting wiring 13) is formed that connects one end portion ("●" mark) of the coil pattern L4$c$ in the layer 27 and the RF terminal $T_{XB}$ of the IC 2 to each other.

In addition, a via conductor is formed that functions as a power feeding line used to connect the connecting position ("●" mark) of the coil pattern BL2 and the coil pattern BL3 in the layer 27 to the power source line (Vdd) to each other.

Next, individual layers 20 to 29 are laminated and a laminated body is produced. In addition, semi-through holes used to separate the laminated body into individual multilayer substrates 2 after being fired are formed so as to surround the regions of the individual substrates 3. Subsequently, the laminated body is subjected to low-temperature firing while being pressurized, thereby forming an assembly of the substrates 3.

Next, the IC 2 and other mount devices are mounted before the assembly of the substrates 3 is separated into the individual substrates 3, and the assembly of the substrates 3 in a state in which various types of components are mounted thereon is coated with resin using a dispenser, for example. In addition, after the resin is dried and hardened using an oven, for example, the assembly of the substrates 3 is separated into individual modules along the semi-through holes, and thus, the module 1 is produced.

As described above, when viewed in a top view, the coil patterns BL1, BL2, and BL3 defining the balun 9 are preferably arranged so as to surround the coils L3 and L4 defining the matching circuit 11 and the connecting wirings 12 and 13, in the vicinity of a boundary between the second wiring layer 5 and the insulator layer 6.

In addition, ceramic green sheets may be further laminated to form the first wiring layer 4 and the second wiring layer 5, and electrical circuits may be further provided in the first wiring layer 4 and the second wiring layer 5.

In the module 1 illustrated in FIG. 1, the RF signal as a carrier wave input to the input terminal P1 through the antenna terminal ANT is subjected to a filtering process that allows a signal having a desired frequency to pass in the filter circuit 10. In addition, the RF signal subjected to the filtering process by the filter circuit 10 is converted from an unbalanced state into a balanced state in the balun 9, and is input to the RF terminals $T_{XA}$ and $T_{XB}$ of the IC 2 through the connecting wirings 12 and 13.

The RF signal input to the IC 2 is demodulated into a baseband signal by the demodulation circuit unit, and input to the baseband signal-use circuit 7 provided in the first wiring layer 4. In addition, the baseband signal subjected to various processes by the baseband signal-use circuit 7 is output to a signal line provided in the motherboard MB through the connecting wiring 8.

As described above, according to the above-mentioned preferred embodiments, the IC 2, which includes the modulation circuit unit arranged to modulate the baseband signal into the RF signal and the demodulation circuit unit arranged to demodulate the RF signal into the baseband signal, is preferably mounted on the upper surface of the substrate 3.

On the other hand, the baseband signal-use circuit 7 is preferably provided in the first wiring layer 4 disposed on the upper surface side of the substrate 3, the RF signal-use circuits, such as the balun 9 and the filter circuit 10, for example, are provided in the second wiring layer 5 disposed on the lower surface side of the substrate 3, and one surface of the insulator layer 6 disposed between the first wiring layer 4 and the second wiring layer 5, the substantially flat-plate ground electrode pattern GNDa is preferably arranged so as to cover substantially the entire surface. Accordingly, since the ground electrode pattern GNDa provided on one surface of the insulator layer 6 functions as an electromagnetic shield, it is possible to prevent the baseband signal-use wiring pattern provided in the first wiring layer 4 and the RF signal-use wiring pattern provided in the second wiring layer 5 from being electromagnetically coupled to each other, and thus, it is possible to prevent the noise signal, included in the RF signal propagating through the RF signal-use wiring pattern, from propagating to the baseband signal-use wiring pattern and flowing into the IC 2.

In addition, the balun 9 is preferably provided in the second wiring layer 5 using the RF signal-use wiring pattern, and the RF terminals $T_{XA}$ and $T_{XB}$ of the IC 2 mounted on the upper surface of the substrate 3 are electrically connected to the balanced-side terminals P3 and P4 of the balun 9 using the connecting wirings 12 and 13, respectively. On the other hand, when viewed in a top view, the coil patterns BL1, BL2, and BL3 defining the balun 9 are preferably arranged on the upper surface side of the second wiring layer 5 so as to surround the connecting wirings 12 and 13 between the IC 2 and the balun 9. Therefore, the coil patterns BL1, BL2, and BL3 of the balun 9, which surround the connecting wirings 12 and 13, function as electromagnetic shields, and the noise signal included in the RF signal that propagates through individual various electrical circuits adjacent to the balun 9 and provided in the second wiring layer 5, for example, the RF signal-use wiring pattern forming the filter circuit 10, is prevented from propagating to the connecting wirings 12 and 13 between the IC 2 and the balun 9. Accordingly, the noise signal included in the RF signal is prevented from flowing into the IC 2 mounted on the substrate 3.

In addition, on the upper surface side of the second wiring layer 5 closest to the IC 2 mounted on the upper surface of the substrate 3, the balanced-side wiring pattern 9a on the output side of the balun 9 is preferably provided and used to output the RF signal in a balance state to the IC 2 mounted on the upper surface of the substrate 3, and thus, when viewed in a top view, the balanced-side wiring pattern 9a can be easily arranged so as to surround the connecting wirings 12 and 13 used to connect the balanced-side terminals P3 and P4 to the RF terminals $T_{XA}$ and $T_{XB}$ of the IC 2.

In addition, the unbalanced-side wiring pattern 9b of the balun 9 including the RF signal-use wiring pattern is preferably provided on a surface side lower than the balanced-side wiring pattern 9a. Therefore, by maintaining a large distance between the RF signal-use wiring pattern on the unbalanced side used to input the RF signal in an unbalanced state to the unbalanced-side wiring pattern 9b and the connecting wirings 12 and 13 between the IC 2 and the balun 9, the noise signal propagating from the RF signal-use wiring pattern on the unbalanced side is prevented from being transmitted to the connecting wirings 12 and 13.

In addition, the matching circuit 11 used to perform the impedance matching and the phase adjustment is preferably provided in the second wiring layer 5, and the RF terminals $T_{XA}$ and $T_{XB}$ of the IC 2 are connected to the balanced-side terminals P3 and P4 of the balun 9 through the matching circuit 11 using the connecting wirings 12 and 13. On the other hand, since the matching circuit 11 is surrounded by the coil patterns BL1, BL2, and BL3 defining the balun 9 when viewed in a top view, the wiring patterns of the balun 9, which surround the matching circuit 11, function as electromagnetic shields, and the noise signal included in the RF signal processed by the filter circuit is prevented from propagating to the matching circuit 11 directly connected to the RF terminals $T_{XA}$ and $T_{XB}$ of the IC 2 and hence flowing into the IC 2.

In addition, the present invention is not limited to the above-mentioned preferred embodiments, and it should be understood that various modifications may be made within the scope of the present invention. In addition, it is only necessary for at least a portion of the RF signal-use wiring pattern forming the balun 9 to surround the connecting wirings 12 and 13 between the RF terminals $T_{XA}$ and $T_{XB}$ of the IC 2 and the balanced-side terminals P3 and P4 of the balun 9.

In addition, while, in the preferred embodiments described above, the function of demodulating the RF signal input through the antenna terminal ANT into the baseband signal has been described, it is preferable to also configure the balun 9 as described above, when a baseband signal processed in a wireless communication device is modulated into an RF signal and output. In addition, while, in the preferred embodiments described above, the ceramic multilayer substrate is described as an example, the substrate 3 may also be formed using a multilayer substrate, such as a resin substrate, a printed substrate, or other suitable substrate, for example.

In addition, preferred embodiments of the present invention may be applied to various modules each of which includes a substrate on which an IC is mounted, the IC including a modulation circuit unit configured to modulate a baseband signal into an RF signal and a demodulation circuit unit configured to demodulate an RF signal into a baseband signal.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A module comprising:
   a substrate including an IC disposed on an upper surface side thereof, the IC including a modulation circuit unit arranged to modulate a baseband signal into an RF signal and a demodulation circuit unit arranged to demodulate an RF signal into a baseband signal; wherein
   the substrate includes a first wiring layer provided on the upper surface side, a second wiring layer disposed on a lower surface side of the first wiring layer, and an insulator layer disposed between the first wiring layer and the second wiring layer;
   a baseband signal-use wiring pattern is provided in the first wiring layer;
   an RF signal-use wiring pattern is provided in the second wiring layer;
   on one surface of the insulator layer, a substantially flat-plate ground electrode pattern is arranged to cover substantially an entire surface thereof;
   at least a balun is provided in the second wiring layer and defined by the RF signal-use wiring pattern;
   when viewed in a top view, at least a portion of the RF signal-use wiring pattern defining the balun is arranged on an upper surface side of the second wiring layer so as to surround a connecting wiring that electrically connects an RF terminal of the IC and a balanced-side terminal of the balun to each other;

a matching circuit is provided in the second wiring layer, and when viewed in the top view, the matching circuit is surrounded by the RF signal-use wiring pattern defining the balun;

the RF terminal and the balanced-side terminal are connected to each other via the connecting wiring through the matching circuit; and the matching circuit includes at least one coil.

2. The module according to claim 1, wherein the RF signal-use wiring pattern of the balun arranged on the upper surface side of the second wiring layer to surround the connecting wiring is a balanced-side wiring pattern of the balun.

3. The module according to claim 2, wherein an unbalanced-side wiring pattern of the balun is provided on a surface located lower than the balanced-side wiring pattern.

* * * * *